United States Patent [19]

Müller

[11] Patent Number: 5,346,882
[45] Date of Patent: Sep. 13, 1994

[54] JOSEPHSON CONTACTS IN HIGH TEMPERATURE SUPERCONDUCTORS AND METHOD OF FABRICATION THEREOF

[76] Inventor: Paul Müller, Graf-Konrad-Strasse 8, W-8000 Munich 40, Fed. Rep. of Germany

[21] Appl. No.: 917,177

[22] Filed: Jul. 20, 1992

[30] Foreign Application Priority Data

Jul. 19, 1991 [DE] Fed. Rep. of Germany ....... 4124048

[51] Int. Cl.$^5$ ............................................. C30B 29/10
[52] U.S. Cl. ................... 505/190; 505/702; 505/703; 505/729; 505/329; 505/450
[58] Field of Search ...................... 156/600, 610, 617.1; 505/1, 729, 702, 703

[56] References Cited

U.S. PATENT DOCUMENTS

| | | | |
|---|---|---|---|
| 4,956,335 | 9/1990 | Agostinelli et al. | 505/701 |
| 4,980,339 | 12/1990 | Setsune et al. | 505/702 |
| 5,047,389 | 9/1991 | Woolf et al. | 505/701 |
| 5,128,316 | 7/1992 | Agostinelli et al. | 505/701 |
| 5,141,919 | 8/1992 | Nakao et al. | 505/701 |

FOREIGN PATENT DOCUMENTS

| | | |
|---|---|---|
| 0390704 | 10/1990 | European Pat. Off. |
| 0412199 | 2/1991 | European Pat. Off. |
| 3736791 | 5/1989 | Fed. Rep. of Germany |
| 3822904 | 1/1990 | Fed. Rep. of Germany |

OTHER PUBLICATIONS

Taluocchio "Electrical Contact to Superconductors" IEEE Trans. CHMT (1989).
Beyers, R. B. et al., "Ti–Ca–Ba–Cu–O superconducting oxides", *IBM J. Res. Develop.*, vol. 33, No. 3, (May 1989), pp. 228–237.
Crabtree, G. W., et al., "Critical Fields and Characteristic Lengths in Copper Oxide Superconductors" in *High–$T_c$ Superconductors*, Plenum Press, New York, 1988, pp. 233–245., month unknown.
Selim, R., et al., "Low–resistance noble metal contacts to high–temperature superconductors" in *J. Appl. Phys.*, 67(1), Jan. 1, 1990, pp. 376–378.
Furukawa, Hiroshi, et al., "Effect of Y Substitution for the Ca Site in the 110 K Phase of (Bi, Pb)–Sr–Ca–Cu–O Superconductors" in *Japanese Journal of Applied Physics*, vol. 30, No. 3A, Mar. 1991, pp. L 346–L 348.
Barone, Antonio, et al., *Physics and Applications of the Josephson Effect*, New York, 1982, pp. 69–70.
Rogers, C. T., et al., "Fabrication of heteroepitaxial $YBA_2Cu_3O_{7-x}$–$PrBa_2Cu_3O_{7-x}$–$YB_2Cu_3O_{7-x}$ Josephson devices grown by laser deposition" in *Appl. Phys. Lett.*, 55(19), Nov. 6, 1989, pp. 2032–2034.
"Rugged Low–Resistance Contacts to High $T_c$ Superconductors", Technical Support Package for Tech Brief, National Aeronautics and Space Administration, Langley Research Center, Hampton, Va. (Dec. 1987).
"Making High–Temperature Superconductors by Melt–Sintering", Technical Support Package for Tech Brief, National Aeronautics and Space Administration, Langley Research Center, Hampton, Va. (Mar. 1979).

*Primary Examiner*—Robert Kunemund
*Attorney, Agent, or Firm*—Cohen, Pontani, Lieberman, Pavane

[57] ABSTRACT

Josephson contacts are fabricated in ceramic compounds from classes of high temperature superconductors. The succession of layers in the single-crystal determines the properties of the Josephson contacts. The supercurrent flows in the direction of the crystallographic c-axis. In a category of substances of high temperature superconductors the Josephson contacts are located in the space between each of two copper oxide planes. In a different class of high temperature superconductors the Josephson contacts are located between each of two single copper oxide planes. The electrical properties such as critical supercurrent density, capacitance and shunt resistance or the Josephson contacts are adjusted by controlled addition or controlled withdrawal of oxygen. Using stacks of such intrinsic Josephson contacts within a single-crystal, current-controllable high frequency generators, Josephson voltage normals and SQUIDS can be realized.

17 Claims, 3 Drawing Sheets

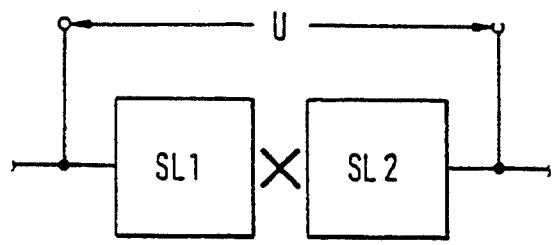
Fig. 1a
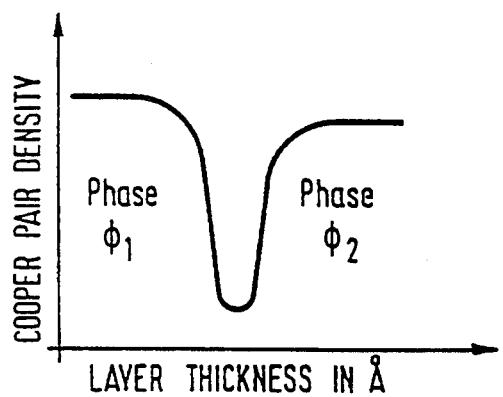
Fig. 1b
Fig. 2
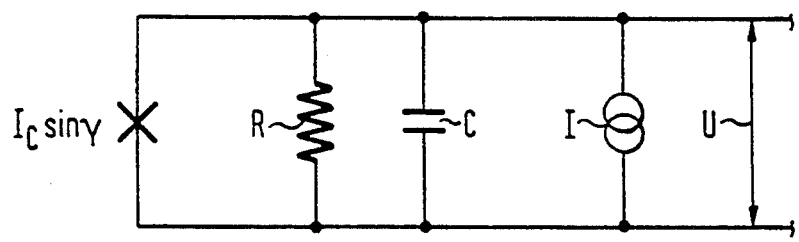
Fig. 3
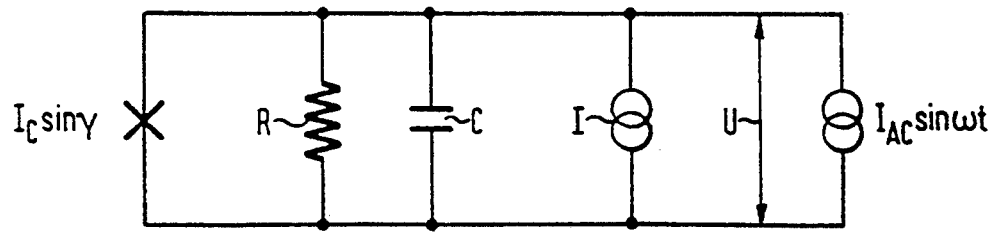

JOSEPHSON CONTACTS IN HIGH TEMPERATURE SUPERCONDUCTORS AND METHOD OF FABRICATION THEREOF

FIELD OF THE INVENTION

The invention is related to Josephson contacts in high temperature superconductors and a method of their fabrication. Several methods of this nature are known from "Superconductor Industry", vol. 4, issue 2, summer 1991, pages 31 through 32.

BACKGROUND OF THE INVENTION

A Josephson contact is a weak link between two superconductors, in which the two Josephson effects are to be observed. This weak link can be a superconducting region, the transition temperature of which is lower than the transition temperature of the adjacent superconductor. The weak link can also be a normal conductor. Finally, the weak link can also be an insulating layer which is thin enough for electrons to "tunnel" through it. Therefore, the "sandwich" of a so called Josephson tunnel contact consists of two superconducting layers which are separated from each other by a thin insulating layer.

For example, the superconducting layers are formed from metallic strips, 1 mm wide and 2000 Å thick, which arc successively vapor-deposited on a glass plate (see Scientific American, vol. 214, 1966, pages 30 through 39). Tin, for example, may be used as a superconducting metal. Between the two tin strips, having a thickness of about 2000 Å, there is a very thin insulating layer having a thickness of about 10 Å, which has been formed by oxidation of the tin to form tin oxide. If the two tin strips are equipped with electrical contacts for current and voltage and the whole arrangement is cooled below the transition temperature for tin in a Dewar vessel, then the physical conditions are given under which Josephson effects can be observed. Because of the low transition temperature for tin (less than 4 Kelvin) this Josephson contact is cooled with pumped liquid helium. In said Dewar vessel the inner vessel, which is cooled with liquid helium is in addition surrounded by an outer vessel, which is cooled with liquid nitrogen.

A Josephson contact cannot only be constructed from super conductors like tin, lead or niobium, but also from ceramic superconductors, which have been known since 1986. While the transition temperature of the classical superconductors, which were discovered in 1911, usually lies between 5 and 20 Kelvin and thus only barely above absolute zero, ceramic superconductors can already lose their electrical resistance at temperatures which are essentially higher. In 1990 the highest known transition temperature was around 125 Kelvin (Spektrum der Wissenschaft, October, 1990, pages 118 through 126). The ceramic superconductors are therefore also called high temperature superconductors. For those high temperature superconductors which have a transition temperature above 77 Kelvin, it is sufficient to use liquid nitrogen for cooling in order to achieve a superconducting state. Liquid nitrogen cooling is simple and can be done at a low price.

For ceramic superconductors one has to deal with crystals, in which different metal oxides form a complicated crystal structure of different coordination polyhedra. A coordination polyhedron is defined as an energetically stable spatial arrangement of large metal atoms, surrounded by small oxygen atoms. It is the chemical bond between copper and oxygen, which is crucial for electrical behavior of almost all high temperature superconductors. In addition to copper further metal atoms like lanthanum, barium, calcium, bismuth, strontium etc. are deposited in the crystal compound. The coordination polyhedra of copper oxide are arranged in planes or double planes.

Within the framework of the present application a crystal is defined as both a single-crystal, which is drawn from a melt, and also a crystal layer, which is deposited epitaxially on a substrate.

In order to fabricate Josephson contacts for ceramic superconductors, a grain boundary between two adjacent crystals is used as a weak spot. From the reference Superconductor Industry mentioned at the beginning, it can be concluded that grain boundary contacts of this nature do not perform as well as Josephson contacts formed of classical low temperature superconductors. For fabricating the thin films of the boundary grain contacts, the methods of laser deposition and photolithography are resorted to. With the laser deposition, for example, three successive layers grow epitaxially on a substrate. Two main problems of these grain boundary contacts are named. The exact location on which the contact between the superconducting and non-superconducting layers occurs is random and is barely controllable. Besides, the generation of a larger number of contacts is not yet controllable.

The principal construction of a Josephson contact is shown graphically in FIG. 1a. The cross symbol between the two superconducting layers stands for the weak link through which a supercurrent I flows as a result of the DC-Josephson effect. The voltage drop at the Josephson contact, which is labelled U, is equal to zero and the supercurrent I flows without any conduction loss when the conditions for the DC-Josephson effect are present. Under the conditions of the AC-Josephson effect the voltage drop U becomes finite so that power is transduced in the contact.

The Josephson effects are assumed to be known. A detailed description is given for example in the already mentioned article Scientific American, vol. 214, 1966, pages 30 through 39, which will be referred to. Accordingly, the electron pairs, so-called Cooper pairs, can tunnel across an insulating barrier between two superconducting regions due to their wave nature. Very many Cooper pairs exist in each superconductor. These Cooper pairs occupy a macroscopic quantum state with the wave function $\Psi = \text{const } e^{i\phi}$, whereby $\phi$ is called the phase of the wave function.

FIG. 1b shows the effect of this concept on a Josephson contact. At a cross section through the succession of layers the superconducting charge carriers are not distributed uniformly. In the two superconducting regions there is a high density of Cooper pairs, while only few or no Cooper pairs are present in the weak spot. The Cooper pair density in the two superconductors SL1 and SL2 can be of the same magnitude, but does not have to be. In the given superconductor SL1 the wave function has the phase position $\phi_1$, in the superconductor SL2 the wave function has the phase $\phi_2$. If the superconductor SL2 was far away, the Cooper pairs in the two separate superconductors would have two determined, but independent phase conditions $\phi_1$ and $\phi_2$. Through the Josephson contact according to FIG. 1a, the phases of the two regions are coupled. Josephson has shown, that the supercurrent I, which flows through the contact according to FIG. 1a as a powerless DC-current, follows the simple relationship $$I = I_c \sin \gamma \quad (1)$$
$$\gamma = \phi_1 - \phi_2,$$

where $\gamma$ is the phase difference and $I_c$ the maximum possible DC-supercurrent.

While, with the DC-Josephson effect, the whole region behaves like a single superconducting region in spite of the weak link, the AC-Josephson effect can be observed under physical conditions, exhibiting a finite potential drop U at the contact. If the transport current I, which is forced into the contact, exceeds the maximum supercurrent $I_c$, the voltage drop U at the contact leads to a change of the phase difference $\gamma$ with time. According to Josephson, the following relationship applies:

$$\gamma = (2e/\hbar)U \quad (2)$$
$$e = \text{elementary charge}$$
$$\hbar = h/2\pi$$
$$h = \text{Planck's constant.}$$

This effect will be assumed to be known. At a specific voltage drop U the phase difference $\gamma$ increases continuously. Because of the sinusoidal relationship (1), the Josephson current I oscillates with frequency, which obeys the following relationship:

$$\gamma = (2e/h)U \quad (2a)$$

This relationship is called Josephson voltage-frequency-relationship. The high frequency AC-current in the contact is related to the radiation of an electromagnetic field. The frequency lies in the microwave region.

The most common model for describing a Josephson contact is the equivalent circuit according to FIG. 2. The DC-Josephson effect occurs, when the externally applied current I is small enough to overcome the barrier (cross symbol) by means of superconduction. With higher transport at current I, a voltage drop U occurs, which not only causes the charging of a capacitor C of the contact and an additional DC-current through a resulting resistance R of the contact, but also causes the supercurrent $I_c \times \sin \tau$ to oscillate according to equation (2). In view of the AC-current, the current branch with the cross symbol corresponds to an inductance, so that the AC equivalent circuit resembles a damped oscillating circuit. From the equivalent circuit the following differential equation can be derived, relating the external DC-current I to the time-varying phase difference $\gamma$:

$$I = I^{(x)} + I^{(R)} + I^{(C)} \quad (3)$$
$$= I_c \sin\gamma + \hbar/(2eR)\dot\gamma + C \hbar/(2e)\ddot\gamma$$

Besides the external current source an external microwave field can also act on the Josephson contact. In this case the equivalent circuit has to be extended by an AC-current source (FIG. 3). Accordingly the differential equation is extended by the term $I_{Ac} \sin \omega t$. The external microwave frequency interferes with the internal Josephson current frequency, so that current jumps occur at determined voltages at the current voltage characteristic of the contact (Shapiro effect).

Classical superconductors, typically consisting of the metals lead, niobium and tin including certain alloys of these metals, have already found a plurality of applications. Belonging to them, a closed superconducting loop with two Josephson contacts, which has become known by the name SQUID (Super Conducting Quantum Interference Device). This deals with the most sensitive contemporary device for detecting magnetic fields. In medical applications, for example, the weak magnetic fields of the brain currents are measured.

A further application follows from the transition from the DC-current Josephson effect to the AC-current Josephson effect. When the critical current $I_c$ is exceeded, the finite voltage drop occurs instantly. The abrupt occurrence of the voltage U is the fastest and least dissipative switching process which is currently known. Based on this ultrafast switches for digital technology have been constructed.

With the AC-current Josephson effect the frequency of the radiated electromagnetic wave is proportional to the voltage drop at the contact. Thus, continuously tunable high-frequency emitters can be built. The highest frequencies achievable to reach up into the THz-range.

An especially important application is the Josephson voltage normal. This application is based on impinging high-frequency fields, i.e. on the alternate circuit according to FIG. 3. During tile operation of such contacts current steps occur in the current voltage characteristic at determined Josephson voltages (Shapiro effect). According to the voltage-frequency relationship (2a) the accuracy of these Josephson voltages depends only on the accuracies with which the microwave frequency and the nature constants contained in the equation can be given. These uncertainties are very minute; the Josephson ratio $2e/h = 4.8359767$ only has a relative uncertainty of 0.3 per million. The inverse of the Josephson ratio lies around 2.068 $\mu$V/GHz. Since 1990 the Federal Republic of Germany has also been using relationship (2a) to define the units of electrical voltage. In order to obtain voltages in the order of 1 Volt for calibrating secondary voltage normals, the German National Bureau of Standards (Physikalisch Technische Bundesanstalt) is currently employing series connections of several thousand Josephson contacts at frequencies of around 90 Ghz.

It is important that, with all mentioned applications, liquid helium has to be used for cooling. In addition, the fabrication of the Josephson contact, on the basis of classical superconductors, is expensive.

With high temperature superconductors which are attractive because of the low amount of cooling required, it is much more difficult to fabricate Josephson contacts. Therefore, applications of high temperature superconductors as Josephson contacts have so far only been realized as single contacts for SQUID's.

SUMMARY AND OBJECTS OF THE INVENTION

The invention faces the task of fabricating Josephson contacts in a way simpler than that possible with the known structurizing methods.

The present invention provides a method for fabricating a high temperature superconductor into a device having at least one intrinsic Josephson contact, comprising the steps of forming, by drawing from a melt of a high temperature superconductor or by epitaxial deposition on a substrate, a small single-crystal having a crystallographic c-axis and an area having dimensions which are smaller than a magnetic field penetration depth perpendicular to the crystallographic c-axis, then fabricating or post-processing the single-crystal in an inert atmosphere containing an inert gas or in a vacuum having a controlled oxygen partial pressure, and subsequently vapor depositing well-conducting contacts at the boundaries parallel to the superconducting layers of the single-crystal. The resulting structure obtains the properties of a Josephson junction when the single-crystal is cooled below its superconducting transition temperature.

The present invention also provides a monocrystalline high temperature superconductor comprising a plurality of small monocrystalline plates arranged in planar layers or double layers, having a spacing between adjacent superconducting layers or double layers in a direction of spacing of said layer or double layers of about 10 times as large as a superconducting Ginzburg-Landau coherence length, said small monocrystalline plates having dimensions in a direction of said superconducting layers or double layers which are not larger that a penetration depth of an external magnetic field parallel to said planes. This high temperature superconductor is formed by the above-described method.

In the invention, a particularity of the crystal structure of high temperature superconductors is used in order to construct Josephson contacts. The high temperature superconductors are crystalline layered structures in which the electrical transport takes place in the copper oxide planes. The electrical conductivity in directions parallel to copper oxide planes can be several orders of magnitude above a conductivity perpendicular to them (conductivity in the c-axis). This anisotropy is shown in FIG. 4 using the example of the high temperature superconductor $Bi_2 Sr_2 Ca Cu_2 O_8$ having a transition temperature of for example 80 to 90 Kelvin. Double planes of copper oxide can be recognized, in which the respective coordination polyhedra are formed from pyramids. Between the copper oxide planes there are disposed layers with bismuth, strontium and calcium atoms.

For the invention two classes of high temperature superconductors can be considered. The first class exhibits double planes of copper oxide, as shown in FIG. 4. Each double plane is a superconducting region with a high density of Cooper pairs. The respective Josephson contacts are located between the double planes. Examples for high temperature superconductors of this class are:

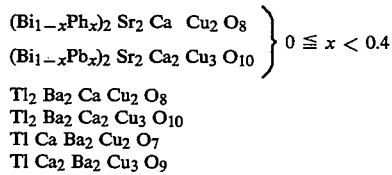

$Tl_2 Ba_2 Ca Cu_2 O_8$
$Tl_2 Ba_2 Ca_2 Cu_3 O_{10}$
$Tl Ca Ba_2 Cu_2 O_7$
$Tl Ca_2 Ba_2 Cu_3 O_9$

An example for a second class of high temperature superconductors, in which the copper oxide is present in simple planes instead of double planes, is $Tl Ba_2 Cu O_5$. The coordination of copper and oxygen in these planes occurs in octahedra. Also, between each of two such planes, Josephson contacts can be formed with the technique according to the present invention.

It appears that superconductors having a metal (1) component taken out of the 3. 4. and 5. main group can advantageously be used.

Former realizations of Josephson contacts with high temperature superconductors aimed at making use of natural or artificially fabricated grain boundaries. In the state of the art, the properties of the grain boundaries were responsible for the weak link between two superconducting regions. This approach required a tremendous amount of effort in the fabrication of the contact. In spite of the extreme effort Josephson contacts of this kind are hard to reproduce.

By the invention, by targeted modification of the Ginzburg-Landau-coherence length perpendicular to the copper oxide planes, Josephson contacts can be successfully formed between each of two such planes or double planes.

A particularity of the high temperature superconductors is the layered configuration of the copper oxide planes causing a periodic modulation of the Cooper pair density along the direction perpendicular to the layers (crystallographic c-axis). The invention has realized that this modulation can be influenced to the extent that technically usable Josephson contacts are created. A control parameter for the modulation depth, which, by extension of FIG. 1b, can be continued periodically to the right and to the left, is the ratio between the Ginzburg-Landau-coherence length and the spacing of the copper oxide planes or double planes. According to the Ginzburg-Landau-theory of superconductivity, the mentioned coherence length is defined as a measure for the decay of Cooper pair density at a superconductor insulator interface.

In order to influence the coherence length, the crystals are tempered in an atmosphere of inert gas or in vacuum at controlled oxygen partial pressure and at temperatures up to 700° C. until a ratio of the electrical conductivity parallel to copper oxide planes and the conductivity perpendicular to the planes between 10 and around $10^6$ is reached. Thus, the electrical properties of the contacts such as capacitance C and shunt resistance R and critical supercurrent density $j_c$ can be exactly adjusted for the desired application. It is stressed, however, that the actually decisive parameter is the Ginzburg-Landau-coherence length, not the critical supercurrent density.

A single-crystal fabricated according to the invention forms a pile of Josephson contacts of atomic dimension. As the properties of the pile can be traced back to the layers of the single-crystal, the invention is characterized as the fabrication of intrinsic Josephson contacts. In general, the oxygen treatment ends up in reducing the quantum mechanical coupling between the superconducting planes, but in specific crystals however, may cause increased quantum mechanical coupling. Moreover, for achieving intrinsic Josephson contacts, it is necessary for the extension of the single-crystal in the direction of the super conducting planes not to exceed a limit, which is set by the penetration depth of the magnetic field parallel to the planes. If the extension of the crystals exceeds this penetration depth, the proper field of the transport currents through the contact would lead to the formation of flux eddies, which would cover up the desired Josephson effect.

BRIEF DESCRIPTION OF THE DRAWINGS

An embodiment and three possible applications of the invention are discussed in more detail with reference to FIGS. 1 through 8. They show:

FIG. 1 a spatial arrangement of superconductors having a Josephson contact (FIG. 1a) and an example for the corresponding Cooper pair density as a function of position in the vicinity of the contact (FIG. 1b);

FIG. 2 an electrical equivalent circuit of a Josephson contact;

FIG. 3 an electrical equivalent circuit of a Josephson contact in the presence of an additional external microwave field;

DETAILED DESCRIPTION OF THE PREFERRED EMBODIMENTS

Figure 4:
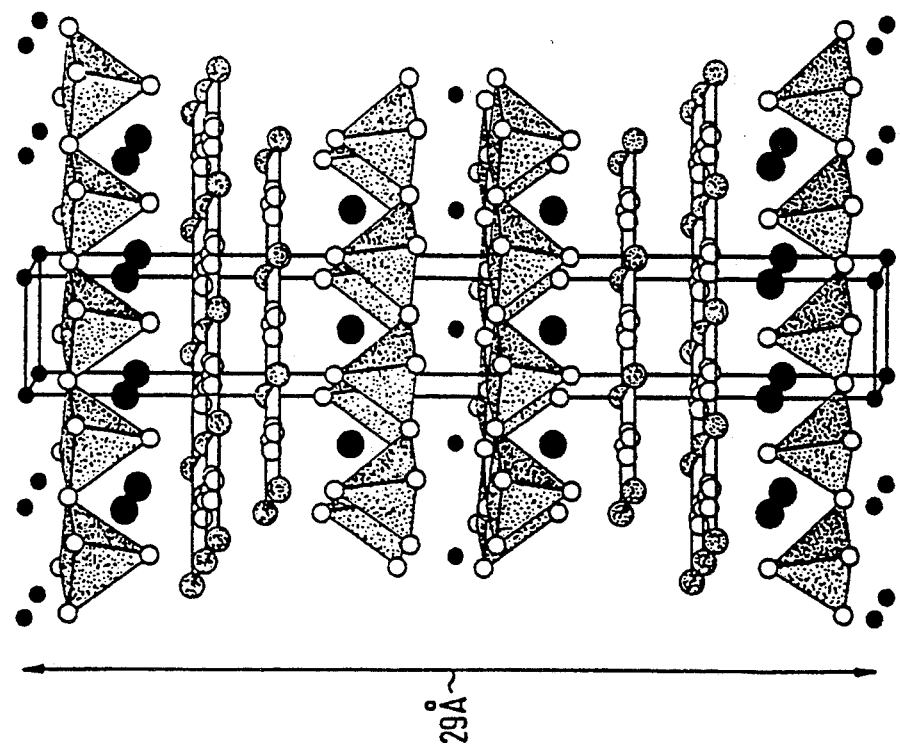
FIG. 4 the layered structure of a ceramic material with coordination polyhedra appropriate to the invention.

In order to produce a Josephson contact with the properties shown in FIGS. 1l, 1b, 2 and 3 the layered structure of a ceramic material is resorted to according to the invention. As an example, FIG. 4 shows the crystal structure of high temperature superconductor $Bi_2 Sr_2 Ca Cu_3 O_8$. The crystal structure of this well-known high temperature superconductor is characterized by a copper oxide double plane. In the double plane the base areas are pyramid-shaped coordination polyhedra which face each other. Relatively thick, weakly conducting layers of bismuth and oxygen lie between copper oxide double planes. One aspect of the invention is the selection of a superconductor with a crystal structure such as the one shown in FIG. 4.

The targeted change in conductivity perpendicular to the plane has the effect that fewer oxygen atoms than usual lie in the intermediate layers and the superconducting layers are more strongly insulated from each other.

Figure 5:
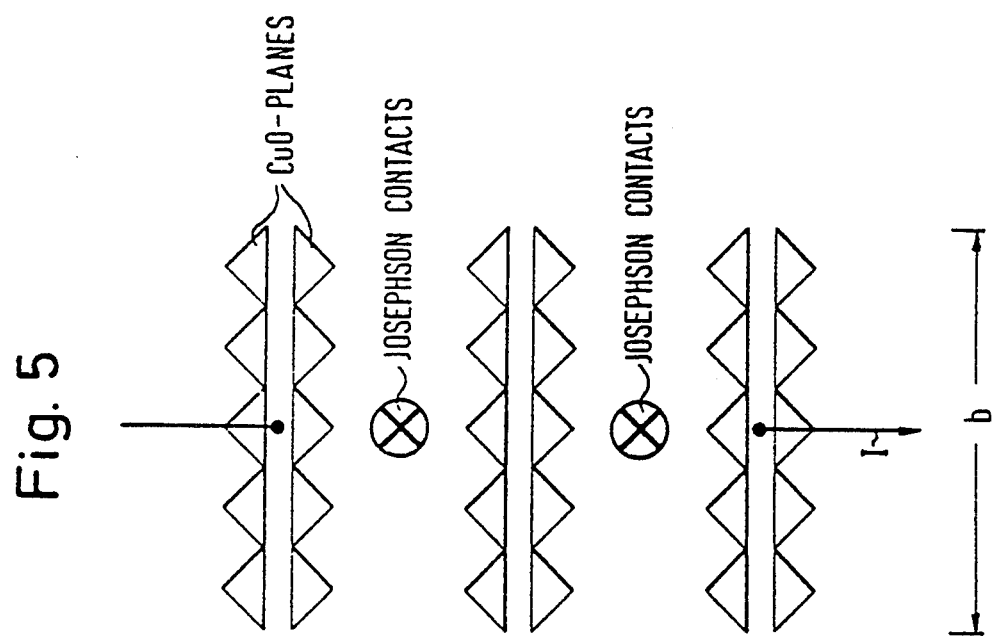
FIG. 5 a schematic cross-section perpendicular to the planes of a high temperature superconductor according to the invention.

A single-crystal treated in such a way can be used as a stack of Josephson contacts. FIG. 5 shows in a model-like way how such a pile is configured and how a supercurrent flows through it. In this embodiment the copper oxide double planes form superconducting regions between which the generated weak spots are located. If a current I flows perpendicular to the direction of the layers in the single-crystal according to the invention, the crystal, as such, shows the properties that go back to the Josephson effects. For example, a critical current $I_c$ can be detected at the crystal, which, if exceeded, causes a voltage drop at the crystal, and microwave energy is radiated.

It is also important for the invention that width b of single-crystal in the direction of the planes does not become too large. With the high temperature superconductor shown in FIG. 4 it turned out to be effective, when the single crystal has an area of 30 $\mu m \times 30$ $\mu m$. This dimension in horizontal direction is smaller than the penetration depth of the magnetic field in this direction, which in the selected embodiment is approximately 100 $\mu m$.

The invention can be applied wherever Josephson contacts based on classical superconductors have already found application. In all applications the effort needed for the fabrication of the Josephson contacts and the effort needed for the integration with other circuit elements is substantially lower than that needed before. In addition, the use of high temperature superconductors permits the use of liquid nitrogen as a coolant. The packaging density of an arrangement of several Josephson contacts can be reduced to atomic orders of magnitude.

Figure 6:
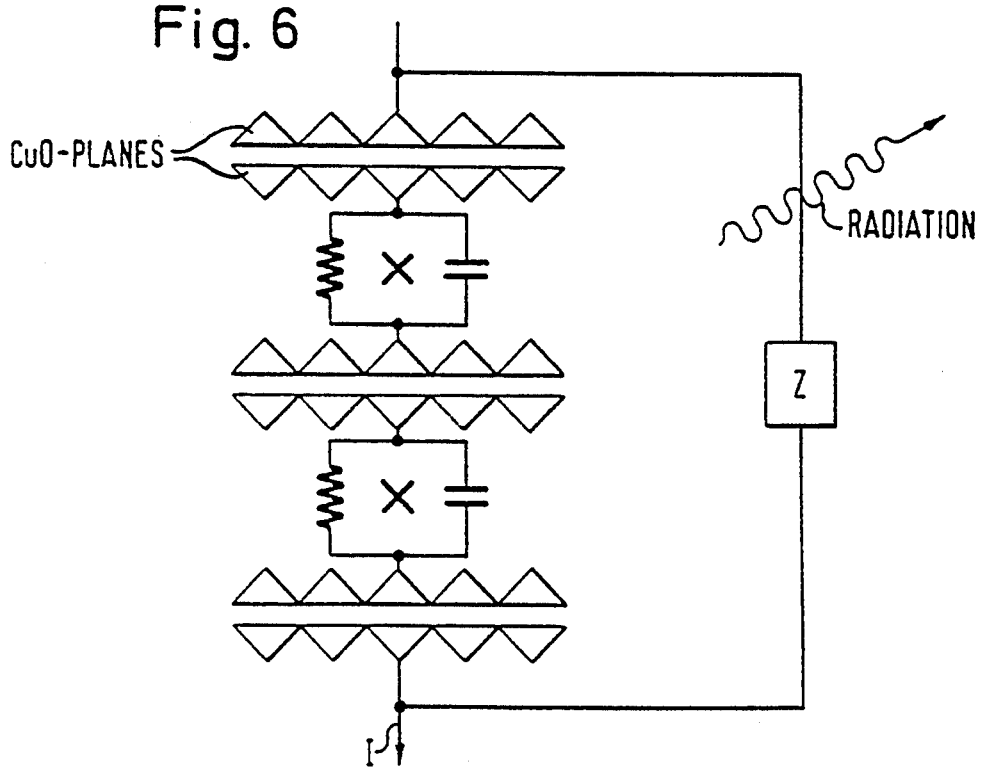
FIG. 6 a model of a current-controlled high-frequency emitter according to the invention.

FIG. 6 schematically shows—thereby resembling FIG. 5—the section across the crystal structure of $Bi_2 Sr_2 Ca Cu_2 O_8$ perpendicular to the copper oxide planes. In addition, the model according to FIG. 2 is superimposed on each Joseph son contact. If a voltage drop U across this configuration is obtained by an externally applied current I, the frequency of microwave radiation obeys the relationship $$f = (1/N)(2e/h) \cdot U \qquad (4)$$

N = number of the Joseph son contacts connected in series.

The corresponding differential equation (3) being non-linear, the individual Josephson contacts can be locked together, i.e. emit electromagnetic radiation of constant phase. In the interaction between the individual Josephson contacts the fact that the inductance of parallel resonance circuits connected in series is not a linear element comes into play. In the single-crystal according to the invention the Josephson contacts are so close together that the interaction from contact to contact takes place across an internal feedback. As an example, more than N = 50 Josephson contacts can form a group, which are tuned to each other by a fixed phase-relationship. In the Shapiro effect this phase coincidence becomes obvious by the fact that the voltage steps are N times larger than they would be for a single Josephson contact.

In the examined embodiment the little crystal plate is 3 $\mu m$ thick. The number of possible contacts amounts to e.g. 700 per/$\mu m$ in crystal thickness. This high number of contacts allows relatively high radiation powers, a crucial advantage to the series connection of discrete contacts. In the series connection of discrete contacts the dimension of the arrangement has an upper limit caused by the wave length of the emitted radiation. The packaging density of the Josephson contacts is low with currently known structurizing methods. The packaging density in the crystal according to the invention, however, is determined by the spacing of the planes according to FIG. 4 and exceeds the known packaging densities by several orders of magnitude.

The crystal can be used as a current-controlled high frequency emitter. The feedback-impedance Z symbolizes the internal feedback. With series connection of discrete Josephson contacts in a classical sense an external circuit to obtain the locking process is unavoidable at this point. The crystal property according to the invention was verified by microwave radiation in the X-band region. The X-band region covers frequencies from 10 to 12 GHz. With the crystal according to the invention, however, substantially higher frequencies may be generated. The frequency can be controlled by varying the current I.

Figure 7:
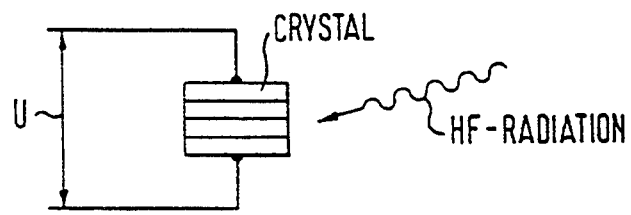
FIG. 7 the principle of a Josephson voltage normal according to the invention.

The inversion of the arrangement according to FIG. 6 leads to a Josephson voltage normal (FIG. 7). The crystal is exposed to microwave radiation of defined frequency. The voltage U generated at the crystal obeys equation (4). The voltage drop of the N participating Josephson contacts add up. With a microwave frequency of 10 GHz a voltage of U=2 mV was achieved. With correspondingly high capacitances C the voltage U at the crystal may be generated without it being necessary to send a current I through it. The impinging microwave radiation alone is sufficient for generating the DC-current.

Figure 8:
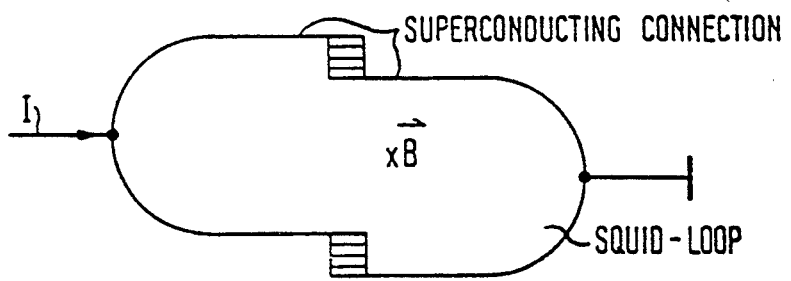
FIG. 8 the principle of a SQUID-loop for measuring weak magnetic fields with intrinsic Josephson contacts according to the invention.

Also the magnetic field detector known as SQUID can be realized in a way substantially simpler than before with the intrinsic Josephson contacts. FIG. 8 shows two single-crystals according to the invention. The two crystals are connected in the known way by superconducting connections in order to form a loop. Even very small magnetic fields perpendicular to this loop are in a position to cause measurable changes of the critical current in the superconductor arrangement. A SQUID according to FIG. 8 can be fabricated by integrated planar circuit technology. For that purpose the two crystals have to be integrated into the superconducting ring in such a way that the current in the ring passes the crystals parallel to the respective crystallographic c-axis.

Another possible application of the invention is the production of ultra-rapid switches by serial coupling of intrinsic Josephson junctions.

I claim:

1. Method for fabricating high temperature superconductors, which, after the following fabrication steps, form at least one intrinsic Josephson junction:
   a small single-crystal, the dimensions of which are below the penetration depth of the magnetic field perpendicular to the crystallographic c-axis, is drawn from the melt of a high temperature superconductor or deposited epitaxially on a substrate;
   the single-crystal is fabricated or post-processed in an inert atmosphere of in a vacuum at controlled oxygen partial pressure;
   at the boundaries parallel to the superconducting layers of the single-crystal well-conducting contacts are vapor-deposited; and
   the single-crystal is cooled below its superconducting transition temperature.

2. A method according to claim 1, characterized in that several Josephson junctions form a densely-packed pile in the single-crystal.

3. A method according to claim 1, characterized in that the ceramic superconductor consists of $Bi_2 Sr_2 Ca Cu_2 O_8$.

4. A method according to claim 1, characterized in that the ceramic conductor has been selected from the class

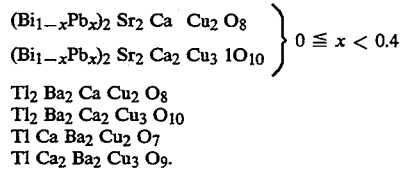

5. A method according to claim 1, characterized in that the ceramic superconductor consists of $Tl Ba_2 Cu O_5$ or of another ceramic of a class with simple copper oxide planes.

6. A method according to claim 1, characterized by a small single-crystal plate or a monocrystalline layer with a thickness roughly between 100 Å and 10 $\mu$m.

7. A method according to claim 1, characterized by dimensions in the direction of the layers, which are less than 100 $\mu$m × 100 $\mu$m.

8. A method according to claim 7, characterized by a small single-crystal plate of roughly 30 $\mu$m × 30 $\mu$m in the direction of the layers.

9. A method according to claim 1, characterized by argon, helium or nitrogen as an inert gas.

10. A method according to claim 1, characterized in that the controlled oxygen partial pressure is between zero and several hundred bars.

11. A method according to claim 1, characterized by tempering in an argon atmosphere for post-processing.

12. A method according to claim 11, characterized by tempering at roughly 700° C. or lower temperatures.

13. A method according to claim 1, characterized by gold contacts at the boundaries.

14. A method according to claim 1, characterized by contact resistances of less than $10^{-4}$ Ohm cm$^2$.

15. Method for fabricating high temperature superconductors, which, after the following fabrication steps, form at least one intrinsic Josephson junction:
   a small, single-crystal, the dimensions of which are below the penetration depth of the magnetic field perpendicular to the crystallographic c-axis, is drawn from a melt of a high temperature superconductor or deposited epitaxially on a substrate;
   the single-crystal is fabricated or post-processed in an inert atmosphere or in a vacuum at controlled oxygen partial pressure for modifying regions between superconducting layers, planes or double planes, of the small single-crystal;
   at the boundaries parallel to the superconducting layers of the small single-crystal, well conducting contacts are vapor deposited.

16. Method for fabricating high temperature superconductors, which, after the following fabrication steps, form at least one intrinsic Josephson junction;
   a small single-crystal, the dimensions of which are below the penetration depth of the magnetic field perpendicular to the crystallographic c-axis, is drawn from a melt of a high temperature superconductor or deposited epitaxially on a substrate;
   the metal-1-component of the superconducting material comprises one or more metallic elements of the 3, 4, or 5, main group;
   the single-crystal is fabricated or post-processed in an inert atmosphere or in a vacuum at controlled oxygen partial pressure for modifying regions between superconducting layers, planes or double planes of the small single-crystal;
   at the boundaries parallel to the superconducting layers of the small single-crystal, well conducting contacts are vapor-deposited.

17. A monocrystalline high temperature superconductor plate, forming an intrinsic Josephson junction, having superconducting planes, arranged in layers, wherein the spacing of adjacent superconducting layers or double layers is roughly 10 times as large as the superconducting Ginzburg-Landau coherence length in the direction of this spacing, and wherein the monocrystalline plate, or the layers of the plate, have dimensions in the direction of the superconducting planes not larger than the penetration depth of an external magnetic field parallel to the planes, formed by a process comprising the steps of:
- a small single-crystal, the dimensions of which are below the penetration depth of the magnetic field perpendicular to the crystallographic c-axis, is drawn from a melt of a high temperature superconductor or deposited epitaxially on a substrate;
- the single-crystal is fabricated or post-processed in an inert atmosphere or in a vacuum at controlled oxygen partial pressure for modifying regions between superconducting layers, planes or double planes, of the small single-crystal;
- at the boundaries parallel to the superconducting layers of the small single-crystal, well conducting contacts are vapor deposited.

* * * * *